United States Patent
Singh et al.

(10) Patent No.: US 10,060,976 B1
(45) Date of Patent: Aug. 28, 2018

(54) METHOD AND APPARATUS FOR AUTOMATIC DIAGNOSIS OF MIS-COMPARES

(71) Applicant: Cadence Design Systems, Inc., San Jose, CA (US)

(72) Inventors: Sharjinder Singh, Delhi (IN); Sameer Chakravarthy Chillarige, Uttar Pradesh (IN); Robert Jordan Asher, Endicott, NY (US); Sonam Kathpalia, Uttar Pradesh (IN); Patrick Wayne Gallagher, Apalachin, NY (US); Joseph Michael Swenton, Owego, NY (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 9 days.

(21) Appl. No.: 15/151,263

(22) Filed: May 10, 2016

(51) Int. Cl.
*G01R 31/3173* (2006.01)
*G01R 31/317* (2006.01)
*G01R 31/3177* (2006.01)
*G01R 31/327* (2006.01)

(52) U.S. Cl.
CPC ... *G01R 31/31703* (2013.01); *G01R 31/3177* (2013.01); *G01R 31/31704* (2013.01)

(58) Field of Classification Search
CPC ........ G01R 31/31703; G01R 31/31704; G01R 31/3177; G01R 31/3183; G01R 31/318307
See application file for complete search history.

(56) References Cited

U.S. PATENT DOCUMENTS

| | | | | |
|---|---|---|---|---|
| 5,195,096 A | * | 3/1993 | Moore | G11C 29/10 714/718 |
| 5,729,554 A | * | 3/1998 | Weir | G06F 11/261 714/31 |
| 2004/0187060 A1 | * | 9/2004 | Rohrbaugh | G01R 31/318378 714/742 |
| 2005/0015693 A1 | * | 1/2005 | Anzou | G11C 29/54 714/744 |
| 2006/0236154 A1 | * | 10/2006 | Shigihara | G06F 11/263 714/25 |
| 2008/0148120 A1 | * | 6/2008 | Seuring | G06F 11/2242 714/742 |

* cited by examiner

*Primary Examiner* — April Y Blair
*Assistant Examiner* — Dipakkumar Gandhi
(74) *Attorney, Agent, or Firm* — Hunton Andrews Kurth LLP (57) ABSTRACT

Systems and methods disclosed herein provide for automatically diagnosing mis-compares detected during simulation of Automatic Test Pattern Generation ("ATPG") generated test patterns. Embodiments of the systems and methods provide for determining the origin of a mis-compare based on an analysis of the generated test patterns with a structural simulator and a behavioral simulator.

13 Claims, 5 Drawing Sheets

METHOD AND APPARATUS FOR AUTOMATIC DIAGNOSIS OF MIS-COMPARES

TECHNICAL FIELD

The present application relates to systems and methods for automatically diagnosing mis-compares detected during simulation of Automatic Test Pattern Generation ("ATPG") generated test patterns.

BACKGROUND

Each ATPG-generated test pattern contains input and output values for a specific circuit to determine whether the circuit contains any defects. Specifically, ATPG generates its own internal and timing models of the circuit, and, based on the models, performs a simulation on a given set of input values in order to generate output values indicative of a defect-free circuit. During test mode, the input values are applied to the circuit and the resulting output values are compared with the output values in the test pattern in order to determine whether the tested circuit is defect-free.

Further, in order to validate that the output values in the generated test patterns are indicative of a defect-free circuit, the generated test patterns may be validated by another simulator (e.g., distinct from the simulator associated with ATPG) before being applied to the circuit. For example, a behavioral simulator (e.g., NC-Sim Simulator) may simulate the generated test patterns in order to verify that the ATPG-generated output values are equivalent to the output values predicted by the behavioral simulator. However, if the behavioral simulator does not generate the same output values as predicted by the ATPG simulator, the differing output values are designated as mis-compares. Mis-compares can occur for a variety of reasons. For example, the mis-compares can be caused by: (i) modeling issues (e.g., the simulation model created by ATPG is different from the model created by the behavioral simulator), (ii) timing issues (e.g., timing parameters are interpreted differently by ATPG and the behavioral simulator, or (iii) output values for either of the ATPG and the behavioral simulator was generated as a result of computation and not due to simulation. Further, mis-compares can be observed at a circuit output or one of the scan flops utilized during ATPG. If the mis-compares are not addressed, fully-functioning circuits might be screened as faulty when the ATPG-generated test patterns are applied to the circuits. As such, in order to correctly address the mis-compares, the "origins" of the mis-compares in the generated test patterns have to be determined. However, current solutions directed to determining the mis-compare origins are generally very tedious and can involve multiple simulations, wave-form debugging, circuit-tracing or result-matching from many different tools.

As such, there is a need for systems and methods of automatically diagnosing mis-compares detected during simulation of ATPG generated test patterns.

DESCRIPTION OF EMBODIMENTS

The following description of embodiments provides non-limiting representative examples referencing numerals to particularly describe features and teachings of different aspects of the invention. The embodiments described should be recognized as capable of implementation separately, or in combination, with other embodiments from the description of the embodiments. A person of ordinary skill in the art reviewing the description of embodiments should be able to learn and understand the different described aspects of the invention. The description of embodiments should facilitate understanding of the invention to such an extent that other implementations, not specifically covered but within the knowledge of a person of skill in the art having read the description of embodiments, would be understood to be consistent with an application of the invention.

One aspect of the present disclosure is to provide systems and methods of automatically diagnosing mis-compares detected during simulations of ATPG generated test patterns. The methods and apparatuses herein address at least one of the ATPG problems described above.

According to an embodiment, an automatic test pattern generation (ATPG) system includes: a first simulator; a second simulator; and a processor, wherein the processor is configured to: generate, with the first simulator, a plurality of test patterns; simulate, with the second simulator, the plurality of test patterns; compare, with the second simulator, the plurality of test patterns to the simulated plurality of test patterns; and upon determining a mis-compare between the plurality of test patterns to the simulated plurality of test patterns in the comparison, identify an origin of the mis-compare through diagnosis of the plurality of test patterns and the simulated plurality of test patterns.

Figure 1:
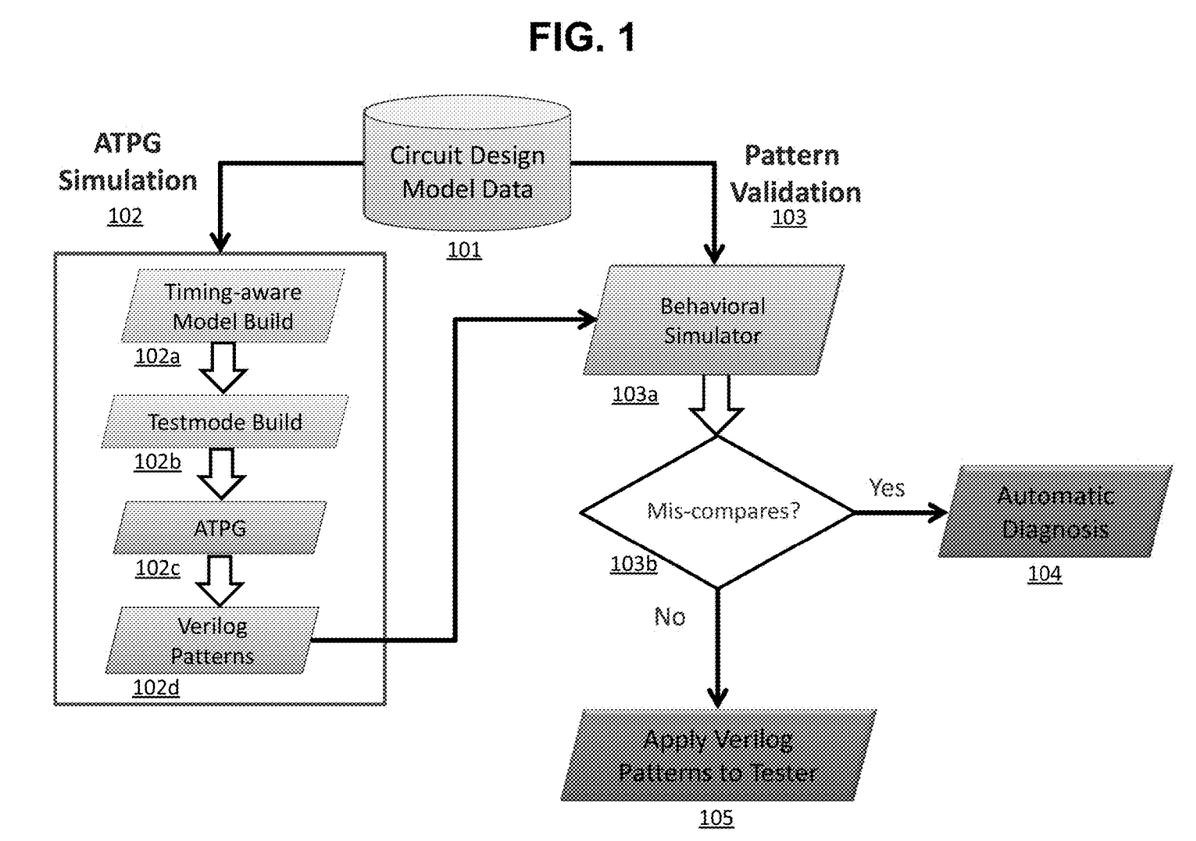
FIG. 1 illustrates an embodiment of a method for validating test patterns generated by ATPG.

FIG. 1 illustrates an embodiment of a method for validating test patterns generated by ATPG. The method includes an ATPG simulation flow 102 and a pattern validation flow 103. In an embodiment, the ATPG simulation flow 102 includes a timing-aware model build step 102a, a testmode build step 102b, a test pattern-generating (i.e., with ATPG) step 102c and a Verilog pattern-generating step 102d. In an embodiment, the pattern validation flow 103 includes a behavioral simulation step 103a and a mis-compare determination step 103b. In an embodiment, at step 102a, a timing aware model is built on information retrieved from the circuit design model data 101. Specifically, in an embodiment, at least one of the netlist, library and Standard Delay Format (SDF) data is retrieved from the circuit design model data 101 in order to generate a timing-aware model build. In an embodiment, the netlist is a representation of the technology cells (e.g., DFT logic, scan flops, etc.) and all of their interconnections in the circuit. Further, in an embodiment, the netlist is formatted in a Verilog file format. In another embodiment, the netlist is formatted in another design file format. In an embodiment, the library includes the collection of technology cells that are utilized to generate the netlist. In an embodiment, the library further includes Verilog files corresponding to the logical and timing representations of the technology cells. Further, in an embodiment, the SDF data includes timing data for the technology cells and associated interconnections. As such, based on the retrieved information from the circuit design model data, a timing-aware model build representing all of the technology cells and interconnections in the circuit (with corresponding logic) can be generated.

Then, in step 102b, during the testmode build, specific test parameters and mechanisms are defined for the circuit. For example, specific clock and pin information (e.g., scan enable, test function, etc.) for the technology cells in the circuit can be defined during the testmode build.

Then, in step 102c, based on the timing-aware model build and the testmode build, ATPG (i) generates input values (e.g., stimulus information), (ii) simulates the input values with a simulator and (iii) determines the output values (e.g., expected responses) based on the simulation of the input values. In an embodiment, ATPG may simulate the input values with a native simulator. In another embodiment, ATPG may simulate the inputs values with a third-party simulator. Also, during step 102c, ATPG generates test patterns including both of the input and output values. In an embodiment, the generated test patterns are the resulting test patterns that ATPG determined are necessary in order to achieve certain fault coverage.

Then, in step 102d, the generated test patterns are converted to a Verilog file format.

In an embodiment, before the Verilog test patterns are applied to the tester, they are validated with a behavioral simulator in step 103a of the pattern validation flow 103. In an embodiment, unlike the ATPG simulator (which is based on a structural model, e.g., the timing-aware model build), the behavioral simulator uses a behavioral model. In an embodiment, the behavioral simulator is utilized for the functional verification of the generated test patterns associated with the circuit. The behavioral simulator generates a behavioral model based on the retrieved circuit design model data 101 (e.g., netlist, library, SDF, etc.). Further, in an embodiment, unlike the ATPG simulator, the behavioral simulator does not need to generate a timing-aware model build or a testmode build since the timing-aware model build and the testmode build have already been incorporated into the Verilog patterns at step 102d of the ATPG simulation flow. As such, any relevant information associated with the timing-aware model build or the testmode build will be provided to the behavioral simulator via the converted Verilog patterns. Therefore, based on the generated behavioral model, as well as the Verilog patterns provided to behavioral simulator, the behavioral simulator: (i) simulates the input values (e.g., stimulus information) from the Verilog patterns, (ii) determines output values (e.g., expected responses) based on the behavioral simulation and (iii) compares the determined output values to the output values in the Verilog patterns.

If any of the determined output values and the Verilog output values are not the same for a specific measurable point (e.g., scan flop or output pin), the differing values at the measurable point are designated as "mis-compares." For example, for a specific measurable point, the output value may be a logical "1" under the ATPG simulation and a logical "0" under the behavioral simulation (or vice versa). In an embodiment, the comparison between the determined output values and the Verilog output values is performed after each output value is determined by the behavioral simulator. In other words, after an output value is determined by the behavioral simulator for a measurable point, the behavioral simulator compares the determined output value to the output value determined by the ATPG simulator for the same measurable point. In another embodiment, the comparison between the determined output values and the Verilog output values is performed after all of the output values are determined by the behavioral simulator. In an embodiment, the behavioral simulator records (and stores in memory (not shown)) the value of each of the mis-compares at the measurable points for later analysis. In an embodiment, the mis-compares could be a result of the different design models used by the ATPG simulator (e.g., structural model) and the behavioral simulator (e.g., behavioral model). In addition, mis-compares could also result from differing constraints (e.g., Synopsis Design Constraints) applied to the ATPG simulator and the behavioral simulator.

As such, in step 103b, it is determined if the simulated Verilog test patterns (e.g., by the behavioral simulator) included any mis-compares. If there were any mis-compares, the pattern validation flow proceeds to step 104. In step 104, the mis-compares in the Verilog test patterns are automatically diagnosed in order to determine the origin of each of the mis-compares in the test patterns. However, if there were no mis-compares, the Verilog test patterns can be considered validated and, thus, may be applied to the tester, as depicted in step 105.

Figure 2A:
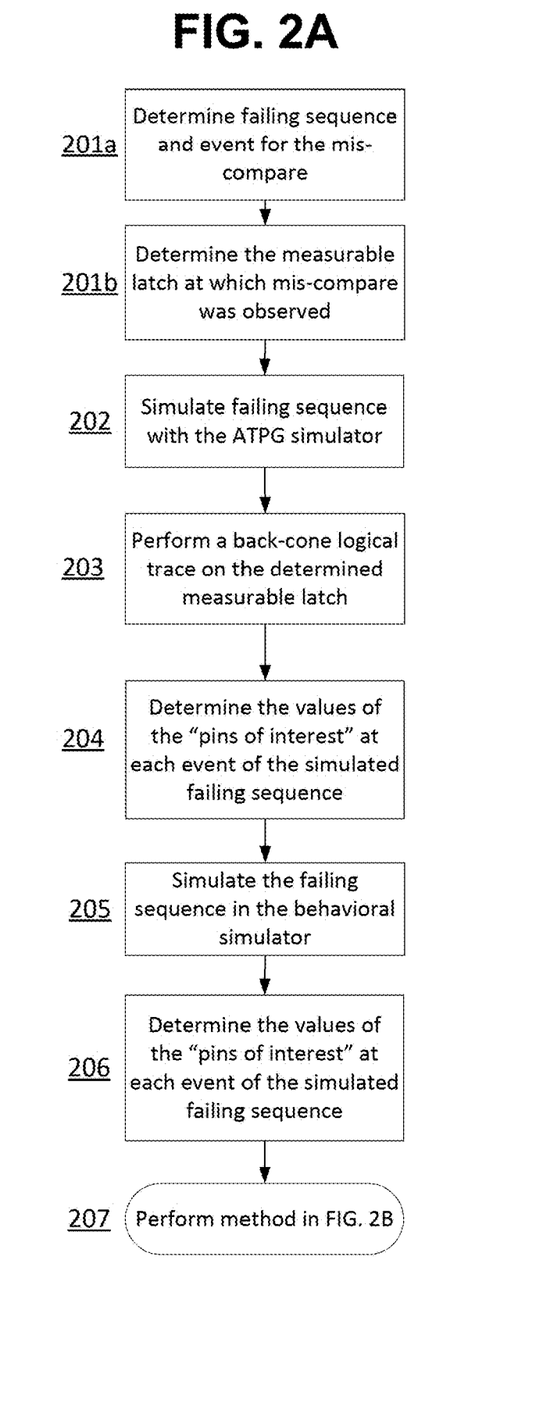
FIG. 2A illustrates an embodiment of a method for determining the "pins of interest" of a mis-compare.

FIG. 2A illustrates an embodiment of a method for determining the "pins of interest" of a mis-compare. In an embodiment, the method of FIG. 2A corresponds to a first part of the automatic diagnosis of the mis-compare (i.e., step 104 of in FIG. 1). Accordingly, the method of FIG. 2A is applied for every mis-compare determined in FIG. 1. As such, for the first mis-compare: (i) a corresponding failing sequence and event is determined, as depicted in step 201a, and (ii) a corresponding measurable point (e.g., latch) on the circuit (e.g., output pin or scan flop) at which the mis-compare was observed is determined, as depicted in step 201b. In an embodiment, the failing sequence refers to the particular pattern in which the mis-compare was observed. In an embodiment, each pattern (e.g., sequence) of the aforementioned generated test patterns includes a unique sequence number associated with it. As such, in order to determine the failing sequence, the unique sequence number of the test pattern including the mis-compare is obtained. In an embodiment, since the same measurable latch can be measured in both failing and non-failing sequences, obtaining only the failing sequences narrows the generated test patterns to only those including the mis-compares. Further, in an embodiment, each sequence is divided into sets of events (e.g., scan load, capture, and scan unload). As such, the failing event of the failing sequence corresponds to the particular event (e.g., scan load, capture, or scan unload) at which the mis-compare was observed. Accordingly, as a result of steps 202a and 202b, the location of the mis-compare in relation to the generated test patterns (e.g., failing sequence and event) and the circuit (e.g., output pin or scan flop) will be known. Then, in step 202, the failing sequence associated with the mis-compare is simulated again with the ATPG simulator. However, in an embodiment, the failing sequence associated with the mis-compare is simulated only until it reaches the failing event.

In an embodiment, since output values (e.g., expected responses) are only measured (and, therefore, recorded) for the measurable latches, if the origin of the mis-compare may have occurred in the cone of logic leading to the measurable latch (and, therefore, not recorded), the output value at each of the pins (input pins and/or scan flops) in the cone of logic (e.g., which could contain thousands of pins) would have to be determined. In an embodiment, the cone of logic includes the combinational logic required for the aforementioned pins (e.g., the respective inputs and outputs of the pins) to result in the output value (e.g., expected response) at the measurable latch. As such, in order to determine the expected response value at each of the pins associated with the cone of logic (e.g., the "pins of interest"), a back-cone logical trace is performed at the measurable latch, as depicted in step 203. In an embodiment, the back-cone logical trace traces back from the measurable latch until an initial scan flop or primary input pin is reached. Further, each of the "pins of interest" identified in the trace are stored in a list for later analysis. In an embodiment, the above back-cone logical trace can be applied for measurable latches associated with a full-scan test mode. In compression test modes, however, the mis-compare will likely be observed at the output pin of the circuit (e.g., the measurable latch) and, therefore, additional combinational logic (e.g., XOR logical functions) leading up to the output pin have to be considered. As such, in order to determine all of the "pins of interest" for the mis-compare, the back-cone logical trace has to also include the cones of logic for each of the likely scannable latches that were combined (e.g., via an XOR logical function) to provide the value at the output pin.

After performing the back-cone logical trace on the measurable latch, either in full-scan mode or compression mode, the output values (e.g., response values) for all of the "pins of interest" in the simulated failing sequence are determined, as depicted in step 204. Specifically, the output values of the "pins of interest" at each event (e.g., logical level) of the simulated failing sequence are retrieved from the ATPG simulator.

Then, in step 205, the failing sequence is simulated with the behavioral simulator. In an embodiment, the failing sequence is simulated only until it reaches the failing event.

Further, after the failing sequence is simulated with the behavioral simulator, the output values (e.g., expected response values) for all of the "pins of interest" (e.g., as determined in step 203) are obtained from the behavioral simulator, as depicted in step 206. Specifically, in an embodiment, the output values of the "pins of interest" at each event of the simulated failing sequence are retrieved from the behavioral simulator after the completion of each simulated (e.g., with the behavioral simulator) event. In an embodiment, the output values for the "pins of interest" simulated with the ATPG simulator and the behavioral simulator are recorded and stored for later analysis. For example, in an embodiment, the two sets of output values can be utilized to perform the method in FIG. 2B, as depicted in step 207.

Figure 2B:
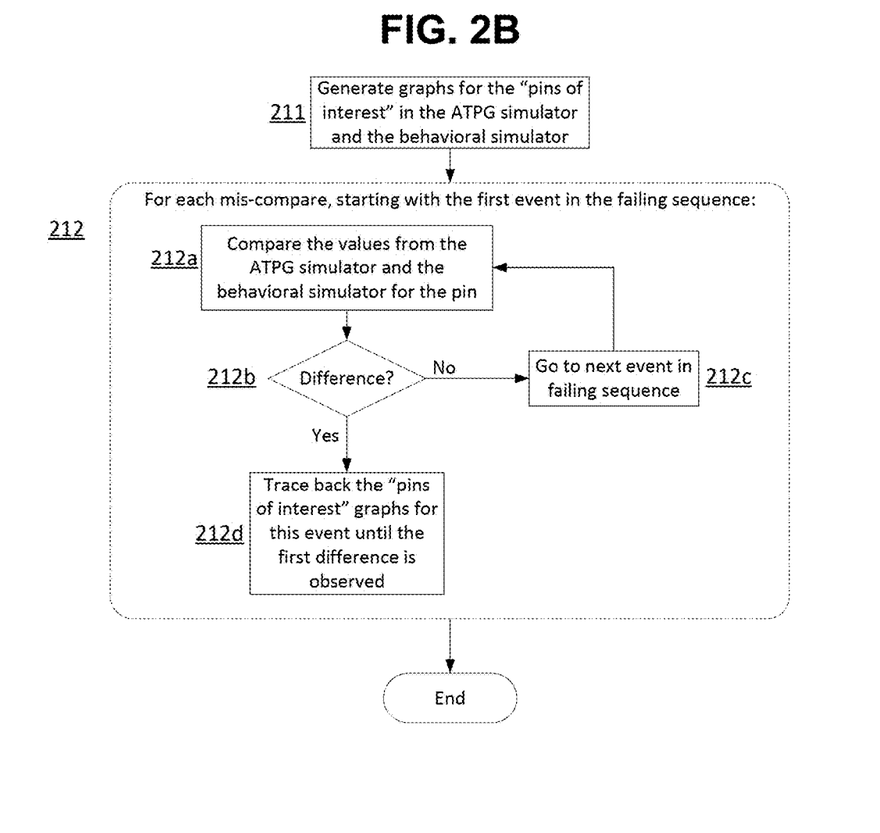
FIG. 2B illustrates an embodiment of a method for determining the "origin" of a mis-compare.

FIG. 2B illustrates an embodiment of a method for determining the "origin" of a mis-compare. In an embodiment, the method of FIG. 2B corresponds to a second part of the automatic diagnosis of the mis-compare (i.e., step 104 of in FIG. 1). In an embodiment, in step 211, graphs are generated for the output values of the "pins of interest" associated with the ATPG simulator and the behavioral simulator. In an embodiment, each of the generated graphs of the "pins of interest" retains the topological order of the pins in the circuit. In an embodiment, the graphs may depict the topological order of the pins starting from the measurable latch to the back-traced initial scan flops or primary input pins (e.g., the back-cone of the measurable latch). Further, pins associated with the same event (e.g., logical level/event boundary) may be grouped together in the graph.

Then, in step 212, for each mis-compare, starting with the first event (e.g., the pin immediately preceding the measurable latch) in the failing sequence, the value associated with the pin for the first event in the ATPG simulator "pins of interest" graph is compared to the value associated with the same pin in the behavioral simulator "pins of interest" graph, as depicted in step 212*a*. In an embodiment, for example, the first event can correspond to a scan unload event. In step 212*b*, it is determined if there was any difference between the ATPG simulator graph and the behavioral simulator graph. In an embodiment, if there were no differences between the two simulators at the first event (e.g., scan unload event), the analysis proceeds to the next event (e.g., the event preceding the first event), as depicted in step 212*c*. In an embodiment, for example, the next event can correspond to a capture event. In an embodiment, the analysis continues to proceed to a following next event until a difference between the two simulators is observed at a pin associated with an event. Once a difference is observed at the pin, the "pins of interest" graphs are traced backwards from the pin until the difference disappears. Specifically, as the "pins of interest" graphs are traced backwards, the values associated with each traversed pin are examined and compared. If the values associated with the traversed pin in the "pins of interest" graphs are the same (e.g., the pin where both simulations had the same result), then the previously traced pin that had the difference of values is the "origin" pin of the mis-compare (as depicted in step 212*d*). As such, in an embodiment, after the "origins" of each of the mis-compares in the failing sequence is determined, the method ends. Further, in an embodiment, the methods of FIGS. 2A and 2B are applied to every sequence including mis-compares (e.g., failing sequences).

Figure 3A:
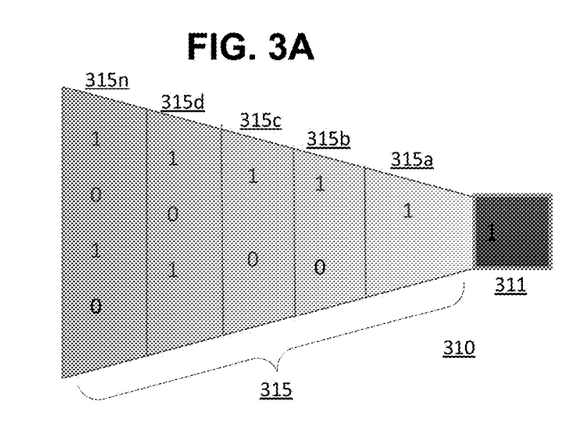
FIG. 3A illustrates an embodiment of a graph of the "pins of interest" associated with the ATPG simulator.

FIG. 3A illustrates an embodiment of a graph of the "pins of interest" associated with the ATPG simulator. In an embodiment, graph 310 includes a measurable latch 311 (e.g., output pin or scan flop) and back cone 315. In an embodiment, the back cone 315 corresponds to the cone of logic leading to the measurable latch 311. As stated previously above, the cone of logic corresponds to the combinational logic associated with the "pins of interest" that results in the value at the measurable latch 311. In an embodiment, the values associated with the "pins of interest" are grouped in to events 315*a*, 315*b*, 315*c*, 315*d* and 315*n*. As such, "pins of interest" associated with the same event (e.g., scan load, capture, or scan unload) are grouped together in the graph. For example, event 315*a* corresponds to a pin with a value of logical "1;" event 315*b* corresponds to a first pin with a value of logical "1" and a second pin with a value of logical "0," etc. In an embodiment, the pins associated event 315*n* may either be initial scan flops or primary input pins. Further, as depicted in FIG. 3A, the combinational logic associated with the pins of the back cone 315 result in a value of logical "1" at the measurable latch 311.

Figure 3B:
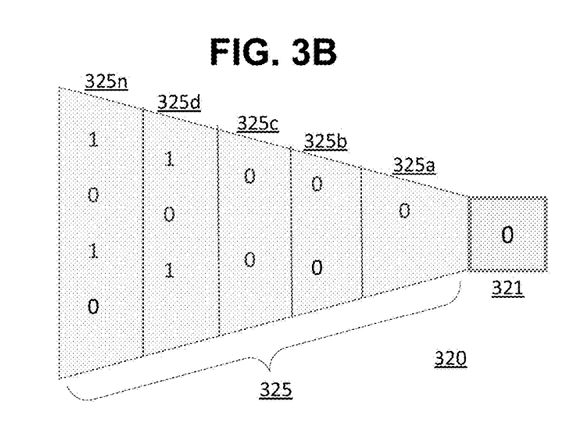
FIG. 3B illustrates an embodiment of a graph of the "pins of interest" associated with the behavioral simulator.

FIG. 3B illustrates an embodiment of a graph of the "pins of interest" associated with the behavioral simulator. In an embodiment, graph 320 include features similar to the graph 310 of FIG. 3A. For example, (i) measurable latches 311 and 321 correspond to the same measurable latch (e.g., pin) in the circuit, (ii) back cones 315 and 325 correspond to the same "pins of interest," and (iii) events 325*a*, 325*b*, 325*c*, 325*d* and 325*n* correspond to the same events as events 315*a*, 315*b*, 315*c*, 315*d* and 315*n*, respectively. However, as depicted in FIGS. 3A and 3B, the value at measureable latch 311 (i.e., "1") is different from the value at measurable latch 321 (i.e., "0"), thereby indicating a mis-compare at the pin. As such, since latches 311 and 321 include different values, the corresponding combinational logic leading to the latches, e.g., back cones 315 and 325 will also be different, as depicted in FIG. 3B.

Figure 3C:
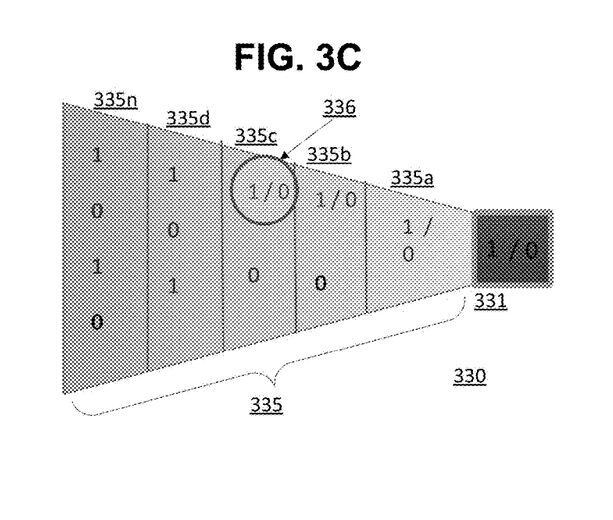
FIG. 3C illustrates an embodiment of the graph of the "pins of interest" associated with the behavioral simulator transposed on the graph of the "pins of interest" associated with the ATPG simulator.

FIG. 3C illustrates an embodiment of the graph of the "pins of interest" associated with the behavioral simulator transposed on the graph of the "pins of interest" associated with the ATPG simulator. In an embodiment, transposed graph 330 includes measurable latch 331, back cone 335, events 335a, 335b, 335c, 335d and 335n, and mis-compare "origin" 336. Measurable latch 331, which corresponds to the same measurable latch in the circuit as measurable latches 311 and 321, depicts the differing values associated with measurable latches 311 and 321. In other words, measurable latch 331 depicts the mis-compare between the ATPG simulator and the behavioral simulator. In an embodiment, applying the method of FIG. 2B to graphs 310 and 320, the "origin" 336 of the mis-compare can be determined. For example, starting with event 335a (e.g., the first event in the failing sequence) at step 212a, it is evident that the values (corresponding to the ATPG simulator and the behavioral simulator, respectively) at the associated pin are different (e.g., the value associated with the ATPG simulator is a logical "1" and the value associated with the behavioral simulator is a logical "0"). As such, according to step 212, (i) the pins in back cone 335 should be traversed backwards from event 335a until the value associated with the ATPG simulator is equivalent to the value associated with the behavioral simulator (e.g., the difference disappears) and (ii) the mis-compare "origin" can be determined by returning to the previous pin that include a difference in values. Accordingly, as depicted in FIG. 3C, the difference between the values disappears at the pin located in event 335d and, therefore, the mis-compare "origin" 336 is located at pin associated with event 335c.

Figure 4:
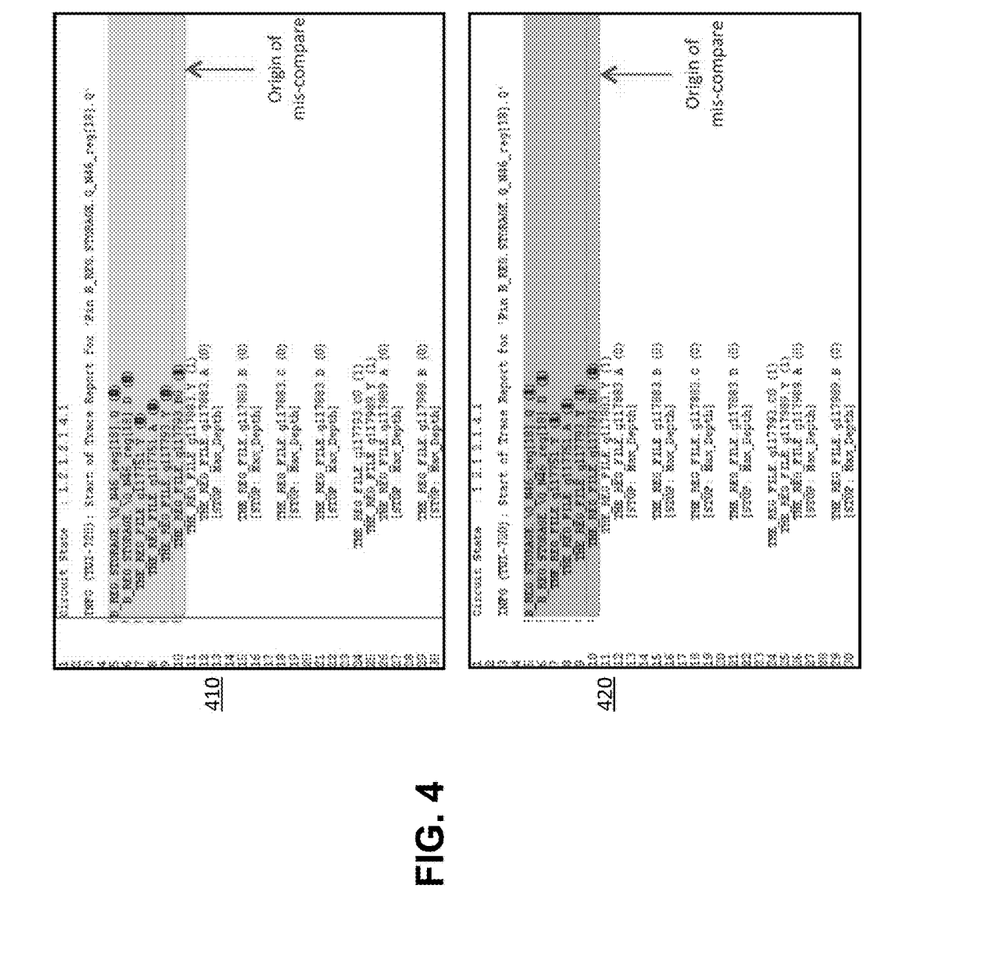
FIG. 4 illustrates another embodiment of the graph of the "pins of interest" associated with the behavioral simulator and the graph of the "pins of interest" associated with the ATPG simulator.

FIG. 4 illustrates another embodiment of the graph of the "pins of interest" associated with the behavioral simulator and the graph of the "pins of interest" associated with the ATPG simulator. FIG. 4 includes graphs 410 and 420. Graph 410 represents the "pins of interest" associated with the ATPG simulator and graph 420 represents the "pins of interest" associated with the behavioral simulator. In an embodiment, line 1 of both of the graphs 410 and 420 corresponds to the unique sequence number of the failing sequence being simulated (e.g., with the ATPG simulator and the behavioral simulator, respectively). As depicted in FIG. 4, the unique sequence number, "1.2.1.2.1.4.1," is the same for both of the graphs 410 and 420. Further, in an embodiment, line 5 of both of the graphs 410 and 420 corresponds to a measurable latch. As depicted in FIG. 4, the value at the measurable latch (e.g., pin) in graph 410 is a logical "0" and the value at the measurable latch in graph 420 is a logical "1," thereby indicating a mis-compare. Accordingly, in order to determine the mis-compare "origin," a back-cone trace (e.g., trace report) is preformed from the measurable latch. In an embodiment, each increasing level of indentation in graphs 410 and 420 corresponds to a different logical event (e.g., scan load, capture, or scan unload) in the cone of logic leading to the measurable latch (e.g., line 5). For example, (i) line 6 of graphs 410 and 420 corresponds to the first logical event behind the measurable latch (ii) line 7 of graphs 410 and 420 corresponds to the logical event behind the first logical event, and so forth. In an embodiment, the first logical event (e.g., line 6) can correspond to event 335a of FIG. 3C and the logical event associated with line 7 can correspond to event 335b of FIG. 3C. As such, applying the method of FIG. 2B, the back-cone trace will continue to proceed backwards through each logical event (e.g., represented by increasing the indentation in the graphs) until the mis-compare "origin" is identified. As depicted in FIG. 4, because the difference between the graphs 410 and 420 disappears at line 11 (e.g., the value associated with line 11 in both of the graphs 410 and 420 is a logical "1"), it can be determined that the origin of the mis-compare occurred at the pin represented by line 10.

The description of the foregoing embodiments may refer to algorithms, sequences, macros, and operations that require processor execution of instructions stored in memory. The processor may be specific to an apparatus, such as automated test equipment (ATE). The processing device executes, or selectively activates in order to execute, a computer program. The computer program is stored in memory associated with the apparatus. Memory available on the apparatus may include a computer readable storage medium, which is not limited to, but may include, any type of disk, including floppy disks, optical disks, CD-ROMs, magnetic-optical disks, and other memory such as read-only memory (ROMs), random access memory (RAMs), electrically erasable programmable read-only memory (EE-PROM), flash memory, and yet other storage such as magnetic or optical cards, or any type of media that stores program instructions. Each of the memory devices implemented in the apparatus is further connected to or coupled to a system bus or a network connection, wired or unwired, capable of facilitating or driving communications.

In the foregoing Description of Embodiments, various features may be grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of the Embodiments, with each claim standing on its own as a separate embodiment of the invention.

Moreover, it will be apparent to those skilled in the art from consideration of the specification and practice of the present disclosure that various modifications and variations can be made to the disclosed systems and methods without departing from the scope of the disclosure, as claimed. Thus, it is intended that the specification and examples be considered as exemplary only, with a true scope of the present disclosure being indicated by the following claims and their equivalents.

What is claimed is:

1. An automatic test pattern generation (ATPG) method, the method comprising:
    generating, with a first circuit simulator, a plurality of test patterns, wherein the first circuit simulator is based on a structural model;
    simulating, with a second circuit simulator, the plurality of test patterns, wherein the second circuit simulator is based on a behavioral model;
    validating, with the second circuit simulator, the plurality of test patterns by comparing the plurality of test patterns to the simulated plurality of test patterns; and
    upon determining a mis-compare between the plurality of test patterns and the simulated plurality of test patterns during the validating, identifying an origin of the mis-compare through diagnosis, with a processor, of the plurality of test patterns and the simulated plurality of test patterns, wherein the diagnosis comprises:

determining, with the processor, (i) a test pattern of the plurality of test patterns including the mis-compare and (ii) a first logical event of the test pattern, wherein the first logical event includes the mis-compare;

simulating, with the first circuit simulator, the test pattern including the mis-compare, wherein the test pattern is simulated until the first logical event is reached;

performing, with the processor, a back-cone logical trace on a measurable latch associated with the mis-compare; and determining, with the processor, a plurality of pins of an integrated circuit chip in a back-cone of the measurable latch based on the back-cone logical trace, wherein the origin of the mis-compare is identified based on the determined plurality of pins.

2. The method of claim 1, wherein the mis-compare corresponds to a difference between a value at a point in a test pattern of the plurality of test patterns and a value at a point in a test pattern of the simulated plurality of test patterns, wherein the point in the test pattern of the plurality of test patterns and the point in the test pattern of the simulated plurality of test patterns are associated with a unique pin in an integrated circuit chip.

3. The method of claim 1, wherein the diagnosis further comprises:

determining, with the processor, values associated with the plurality of pins at each logical event of the simulation of the test pattern including the mis-compare by the first circuit simulator.

4. The method of claim 3, wherein the diagnosis further comprises:

simulating, with the second circuit simulator, the test pattern including the mis-compare, wherein the test pattern is simulated until the first logical event is reached; and determining, with the processor, values associated with the plurality of pins at each logical event of the simulation of the test pattern including the mis-compare by the second circuit simulator.

5. The method of claim 4, wherein the diagnosis further comprises:

generating, with the processor, (i) a first graph corresponding to the values associated with the plurality of pins from the first circuit simulator and (ii) a second graph corresponding to the values associated with the plurality of pins from the second circuit simulator.

6. The method of claim 5, wherein the diagnosis further comprises:

comparing, with the processor, a set of values of the first graph with a set of values of the second graph; and determining, with the processor, the origin of the mis-compare based on the comparison.

7. A non-transitory computer readable medium containing program instructions for an automatic test pattern generation system, wherein execution of the program instructions by one or more processors of a computer system causes one or more processors to perform the following:

generate, with a first circuit simulator, a plurality of test patterns, wherein the first circuit simulator is based on a structural model;

simulate, with a second circuit simulator, the plurality of test patterns, wherein the second circuit simulator is based on a behavioral model;

validate, with the second circuit simulator, the plurality of test patterns by comparing the plurality of test patterns to the simulated plurality of test patterns; and upon determining a mis-compare between the plurality of test patterns and the simulated plurality of test patterns during the validating, identify an origin of the mis-compare through diagnosis of the plurality of test patterns and the simulated plurality of test patterns, wherein the diagnosis comprises:

determining, with the processor, (i) a test pattern of the plurality of test patterns including the mis-compare and (ii) a first logical event of the test pattern, wherein the first logical event includes the mis-compare;

simulating, with the first circuit simulator, the test pattern including the mis-compare, wherein the test pattern is simulated until the first logical event is reached;

performing, with the processor, a back-cone logical trace on a measurable latch associated with the mis-compare; and determining, with the processor, a plurality of pins of an integrated circuit chip in a back-cone of the measurable latch based on the back-cone logical trace, wherein the origin of the mis-compare is identified based on the determined plurality of pins.

8. The non-transitory computer readable medium of claim 7, wherein the mis-compare corresponds to a difference between a value at a point in a test pattern of the plurality of test patterns and a value at a point in a test pattern of the simulated plurality of test patterns, wherein the point in the test pattern of the plurality of test patterns and the point in the test pattern of the simulated plurality of test patterns are associated with a unique pin in an integrated circuit chip.

9. The non-transitory computer readable medium of claim 7, wherein the diagnosis further comprises:

determining values associated with the plurality of pins at each logical event of the simulation of the test pattern including the mis-compare by the first circuit simulator.

10. The non-transitory computer readable medium of claim 9, wherein the diagnosis further comprises:

simulating, with the second circuit simulator, the test pattern including the mis-compare, wherein the test pattern is simulated until the first logical event is reached; and determining values associated with the plurality of pins at each logical event of the simulation of the test pattern including the mis-compare by the second circuit simulator.

11. The non-transitory computer readable medium of claim 10, wherein the diagnosis further comprises:

generating (i) a first graph corresponding to the values associated with the plurality of pins from the first circuit simulator and (ii) a second graph corresponding to the values associated with the plurality of pins from the second circuit simulator.

12. The non-transitory computer readable medium of claim 11, wherein the diagnosis further comprises:

comparing a set of values of the first graph with a set of values of the second graph; and determining the origin of the mis-compare based on the comparison.

13. An automatic test pattern generation (ATPG) system, the system comprising:
   a first circuit simulator, wherein the first circuit simulator is configured to generate a plurality of test patterns, wherein the first circuit simulator is based on a structural model;
   a second circuit simulator, wherein the second circuit simulator is configured to (i) simulate the plurality of test patterns and (ii) validate the plurality of test patterns by comparing the plurality of test patterns to the simulated plurality of test patterns, wherein the second circuit simulator is based on a behavioral model; and
   a processor, wherein the processor is configured to:
      upon determining a mis-compare between the plurality of test patterns and the simulated plurality of test patterns during the validating, identify an origin of the mis-compare through diagnosis of the plurality of test patterns and the simulated plurality of test patterns, wherein the diagnosis comprises:
      determining (i) a test pattern of the plurality of test patterns including the mis-compare and (ii) a first logical event of the test pattern, wherein the first logical event includes the mis-compare;
      simulating the test pattern including the mis-compare, wherein the test pattern is simulated until the first logical event is reached;
      performing a back-cone logical trace on a measurable latch associated with the mis-compare; and
      determining a plurality of pins of an integrated circuit chip in a back-cone of the measurable latch based on the back-cone logical trace, wherein the origin of the mis-compare is identified based on the determined plurality of pins.

* * * * *